(12) United States Patent (10) Patent No.: US 7,939,925 B2
Koide et al. (45) Date of Patent: May 10, 2011

(54) SEMICONDUCTOR DEVICE AND MANUFACTURING METHOD THEREOF

(75) Inventors: Yuki Koide, Kanagawa (JP); Kouichi Meguro, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 280 days.

(21) Appl. No.: 12/258,067

(22) Filed: Oct. 24, 2008

(65) Prior Publication Data

US 2009/0267207 A1    Oct. 29, 2009

(30) Foreign Application Priority Data

Oct. 25, 2007    (JP) .................................. 2007-277308

(51) Int. Cl.
*H01L 23/52*    (2006.01)

(52) U.S. Cl. ........................................ 257/686; 257/698

(58) Field of Classification Search ................ 257/774, 257/686, 698, E23.011, E23.141
See application file for complete search history.

(56) References Cited

U.S. PATENT DOCUMENTS

| | | | | |
|---|---|---|---|---|
| 5,384,689 | A * | 1/1995 | Shen | 361/761 |
| 6,188,127 | B1 * | 2/2001 | Senba et al. | 257/686 |
| 6,586,826 | B1 * | 7/2003 | Glenn et al. | 257/686 |
| 6,614,104 | B2 * | 9/2003 | Farnworth et al. | 257/686 |
| 6,740,981 | B2 * | 5/2004 | Hosomi | 257/778 |
| 6,982,486 | B2 * | 1/2006 | Brooks et al. | 257/738 |
| 7,358,106 | B2 * | 4/2008 | Potter | 438/51 |

* cited by examiner

*Primary Examiner* — Roy K Potter

(57) ABSTRACT

A semiconductor package having a molding unit that seals bonding wires connected to electrode pads of a semiconductor chip is provided with through electrode units comprising bonding wires embedded therein and penetrating the molding unit. A leading end of the respective through electrode units is exposed from an upper surface of the molding unit and a lower surface of the molding unit.

20 Claims, 22 Drawing Sheets

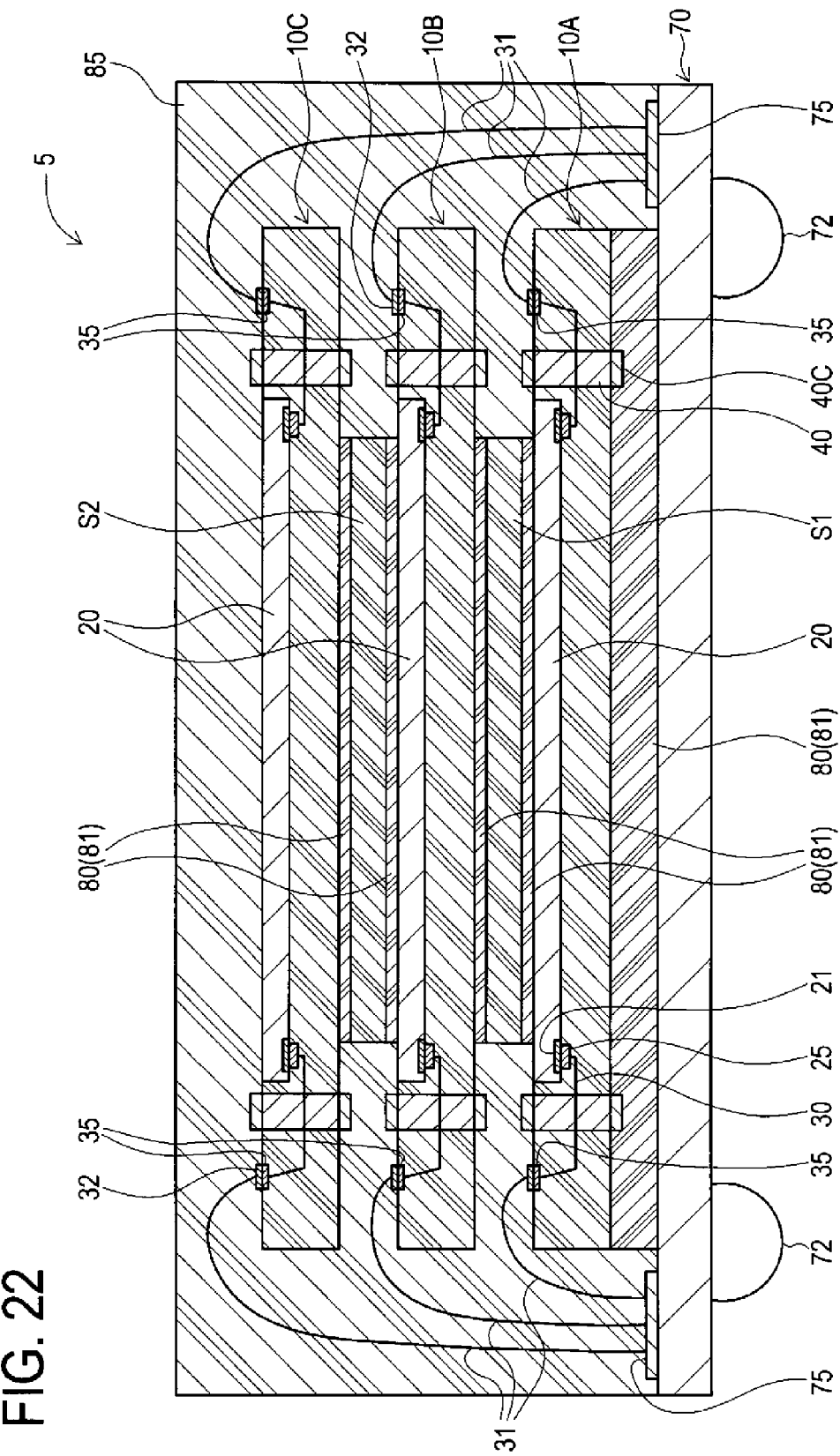

SEMICONDUCTOR DEVICE AND MANUFACTURING METHOD THEREOF

CLAIM OF PRIORITY

This application claims priority from Japanese patent application 2007-277308 filed on Oct. 25, 2007

TECHNICAL FIELD

The invention relates to a semiconductor package and a manufacturing method thereof, and a semiconductor device comprising the semiconductor package.

BACKGROUND

Semiconductor devices (devices comprising one or more semiconductor chips) are commonly used in the manufacture of a wide variety of electronic devices. Electrical testing of semiconductor chips are performed during conventional semiconductor chip fabrication processes to verify the quality of a manufactured semiconductor chip.

Japanese Patent Application Publication Hei.10-135281 discloses a conventional technique for electrically testing a semiconductor chip including an integrated circuit (IC) package in which an electrical test can be carried out with high reliability without the occurrence of defects at electrical contacts used for connecting the IC package with a mounting board. In the IC package of the conventional solution, first electrode pads electrically connected to electrical contact points are arranged along a fringe portion of an element forming surface in the IC chip, so as to allow contact with an electrical testing probe from a direction opposite the element forming surface of the IC chip in which the electrical contacts are rearranged, and conductors penetrating a frame surrounding the IC chip in a height direction thereof and being connected to the first electrical pads are exposed at a back surface of the frame.

The exposed part of the conductors at the back surface of the frame acts as a contact point with the electrical testing probe. The electrical testing probe is brought into contact with the exposed parts of the conductors electrically connected with the electrical contact points through the first electrode pads to thereby carry out electrical testing. Accordingly, defects such as wear, damage and dropout of the electrical contact points from occurring at the time of electrical testing in the IC package may be prevented.

Recently, semiconductor devices have been incorporated in the manufacture of compact electronic devices, thus creating a need for smaller, thinner and better performing semiconductor devices. To address this demand, recent semiconductor devices have begun to employ a MCP (Multi-chip Package) structure, in which a plurality of semiconductor chips is mounted in a single semiconductor package.

However, in a semiconductor device employing a MCP structure, one of the semiconductor chips from amongst the plurality of semiconductor chips may be damaged by mechanical stress or thermal stress applied at the time of mounting the plurality of semiconductor chips in a single semiconductor package.

Moreover, a semiconductor device employing the MCP structure comprises a plurality of semiconductor chips that are packaged in a single semiconductor package (by means of a molding resin, for instance). In such a semiconductor device, since removal of only the "good" semiconductor chips from the molding resin for later reuse is not easily performed after the packaging operation has been completed, semiconductor packages including good semiconductor chips are often discarded. Discarding good semiconductor chips leads to a drop in the manufacturing yield of semiconductor packages and manufacturing yield of semiconductor devices comprising these semiconductor packages.

Furthermore, as the number of semiconductor chips mounted in the semiconductor package comprising a plurality of packaged semiconductor chips increases, it becomes more difficult to form test electrodes for carrying out electrical testing with respect to each and every single semiconductor chip. However, if test electrodes for performing electrical testing cannot be formed in every single semiconductor chip from a plurality of semiconductor chips packaged into a semiconductor package, electrical testing of individual semiconductor chips cannot easily be carried out.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to an aspect of the present invention, there is provided a semiconductor package having a molding unit that seals a bonding wire connected to an electrode pad of a semiconductor chip, comprising a through electrode unit that embeds therein the bonding wire and penetrates the molding unit, leading ends of the electrode pad being exposed from an upper surface of the molding unit and a lower surface of the molding unit.

In one embodiment, the through electrode unit embeds therein the bonding wire connected to the electrode pad of the semiconductor chip and the leading ends of the electrode pad are exposed from the upper surface of the molding unit and the lower surface of the molding unit. It is thus possible to carry out testing of a semiconductor chip through the leading ends of the through electrode unit that are electrically connected to the electrode pad of the semiconductor chip from both sides (the upper surface and the lower surface) of the molding unit. Therefore, electrical testing of the semiconductor chip from both sides of the semiconductor package is enabled, thereby making it possible to broaden the range of electrical testing procedures and make electrical testing easier as compared to the conventional methods.

In another embodiment, a manufacturing method of a semiconductor package is provided that seals a bonding wire connected to an electrode pad of a semiconductor chip, comprising forming a through electrode unit that embeds therein the bonding wire and penetrates the molding unit, leading ends of the electrode pad being exposed from an upper surface of the molding unit and a lower surface of the molding unit. Forming the through electrode unit forms the through electrode unit that embeds therein the bonding wire connected to the electrode pad of the semiconductor chip and penetrates the molding unit, the leading ends of the electrode pad being exposed from the upper surface of the molding unit and the lower surface of the molding unit. It is thus possible to manufacture a semiconductor package of which semiconductor chip can be electrically tested through the leading ends of the through electrode unit that are electrically connected to the electrode pad of the semiconductor chip from both sides (the upper surface and the lower surface) of the molding unit. Therefore, electrical testing of the semiconductor chip from both sides of the semiconductor package manufactured by the manufacturing method is enabled, thereby making it possible to manufacture a semiconductor package wherein the range of electrical testing procedure can be broaden and electrical testing can be made easier as compared to the conventional methods.

In a still further embodiment, a semiconductor device is provided with a semiconductor package having a molding unit that seals a bonding wire connected to an electrode pad of a semiconductor chip, comprising a through electrode unit that embeds therein the bonding wire and penetrates the molding unit, leading ends of the electrode pad being exposed from an upper surface of the molding unit and a lower surface of the molding unit. The through electrode unit of the semiconductor package embeds therein the bonding wire connected to the electrode pad of the semiconductor chip and the leading ends of the electrode pad are exposed from the upper surface of the molding unit and the lower surface of the molding unit. It is thus possible to carry out electrical testing of a semiconductor chip through the leading ends of the through electrode unit that are electrically connected to the electrode pad of the semiconductor chip from both sides (the upper surface and the lower surface) of the molding unit. Therefore, electrical testing of the semiconductor chip from both sides of the semiconductor package is enabled, thereby making it possible to broaden the range of electrical testing procedures and make electrical testing easier as compared to the conventional methods.

According to embodiments of the present invention, the through electrode unit embeds therein the bonding wire connected to the electrode pad of the semiconductor chip and the leading ends of the electrode pad are exposed from the upper surface of the molding unit and the lower surface of the molding unit. It is thus possible to carry out electrical testing of a semiconductor chip through the leading end of the through electrode unit that is electrically connected to the electrode pad of the semiconductor chip from both sides (the upper surface and the lower surface) of the molding unit. Therefore, the semiconductor package, the manufacturing method thereof and the semiconductor device including the semiconductor package according to the present invention allow electrical testing of the semiconductor chip from both sides of the semiconductor package, thereby making it possible to broaden the range of electrical testing procedures and make electrical testing easier as compared to the conventional methods.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 22 is a schematic cross-sectional diagram of a semiconductor package having an MCP structure according to various embodiments of the present invention.

DETAILED DESCRIPTION

Reference will now be made in detail to the preferred embodiments of the claimed subject matter, a method and system for the use of a reputation service provider, examples of which are illustrated in the accompanying drawings. While the claimed subject matter will be described in conjunction with the preferred embodiments, it will be understood that they are not intended to be limit to these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to unnecessarily obscure aspects of the claimed subject matter.

First Embodiment

Figure 1:
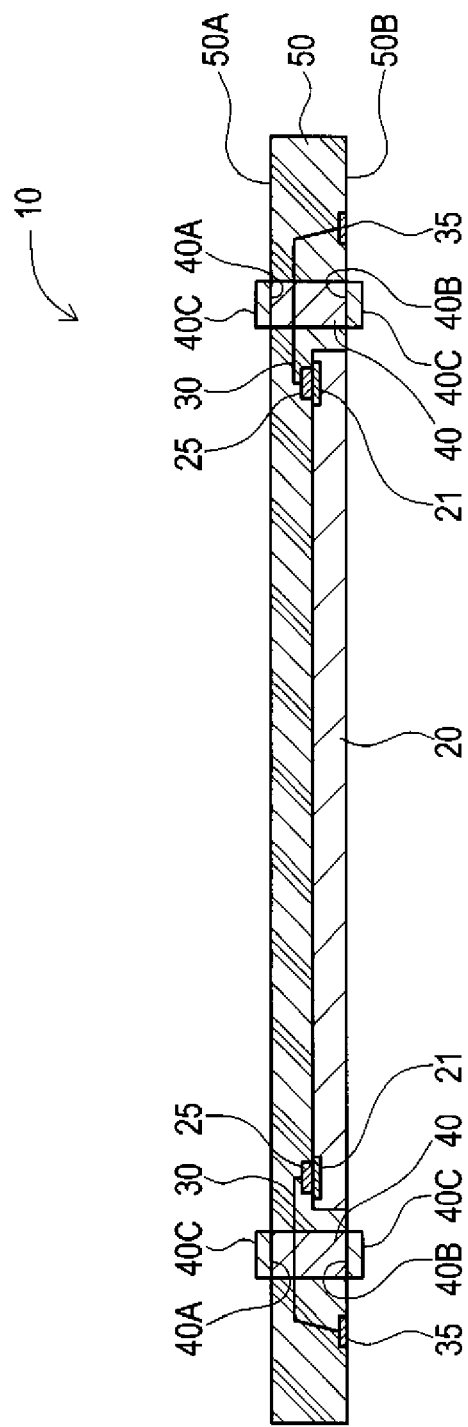
FIG. 1 is a schematic cross-sectional view of a semiconductor package according to one embodiment of the present invention.
Figure 2:
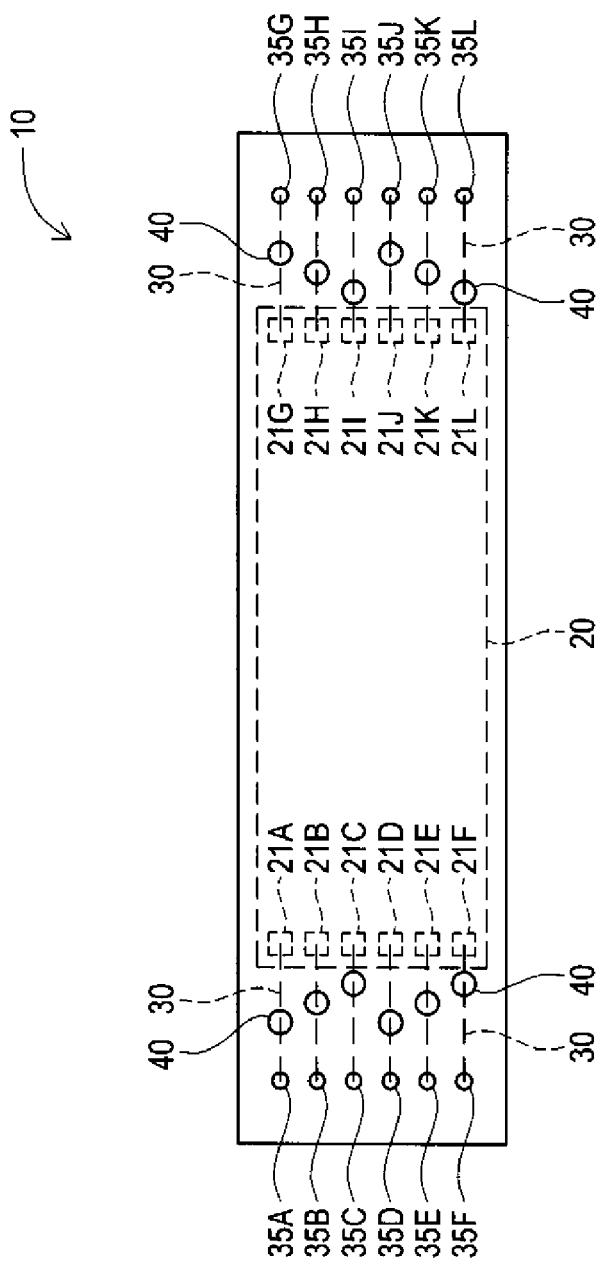
FIG. 2 is a schematic plan view of the semiconductor package according to one embodiment of the present invention.

A first embodiment of the present invention will be described while referring to FIG. 1 and FIG. 2. FIG. 1 is a schematic cross-sectional view of a semiconductor package 10 according to the first embodiment, and FIG. 2 is a schematic plan view of the semiconductor package 10. The semiconductor package 10 has a semiconductor chip 20, metal bumps 25, lead wires 30, lead wire connecting electrodes 35, conductive posts 40 and a molding unit 50.

The semiconductor chip 20 has electrodes 21 provided at opposite ends thereof. FIG. 2 shows a semiconductor chip 20 comprising twelve electrodes 21A through 21L. Electrodes 21A through 21L are respectively connected to the metal bumps 25. Semiconductor chip 20 corresponds to the semiconductor chip of the present invention. Electrodes 21 correspond to the electrode pads of the present invention.

As can be understood from FIG. 2, the present embodiment shows an example in which twelve lead wires 30 are provided. As shown in FIG. 1, one end of each lead wire 30 is connected to metal bumps 25, respectively. The other end of each lead wire 30 is connected to the lead wire connecting electrodes 35A through 35L, respectively. Here, lead wires 30 include gold (Au) wires. Lead wires 30 correspond to the bonding wires of the present invention.

Conductive posts 40 are formed through electrolytic plating. FIG. 2 shows an example in which twelve conductive posts 40 are provided. Here, each conductive post 40 is formed in a cylindrical shape through copper plating. The above-described lead wires 30 are each arranged so as to penetrate the respective conductive posts 40 in a radial direction thereof.

The molding unit 50 seals one semiconductor chip 20, lead wires 30 and a portion of each of the lead wire connecting electrodes 35A through 35L. Molding unit 50 is formed by a resist film 65 to be described later. An upper surface of 50A of the molding unit 50 is formed to be coplanar with an upper surface 40A of each of the conductive posts 40. Here, the upper surface 40A of each conductive post 40 is exposed from the upper surface 50A of the molding unit 50.

A lower surface 50B of the molding unit 50 is formed to be coplanar with a lower surface of the semiconductor chip 20, a lower surface of each of the lead wire connecting electrodes 35A through 35L and a lower surface 40B of each of the conductive posts 40, respectively. Here, the lower surface of the semiconductor chip 20, the lower surface of each of the lead wire connecting electrodes 35A through 35L and the lower surface 40B of each of the conductive posts 40 are respectively exposed from a lower surface 50B of the molding unit 50. In the present embodiment, the diameter of the lower surface 40B of each conductive post 40 is 100 μm to 300 μm, and the diameter of the lower surface of each lead wire connecting electrode 35A through 35L is 50 μm to 60 μm. Also, in the present embodiment, the exposed surface area of the lower surface 40B of each conductive post 40 is wider than the exposed surface area of the lower surface of each lead wire connecting electrode 35A through 35L. The respective lead wire connecting electrodes 35A through 35L correspond to the wire connecting units of the present invention.

The conductive posts 40 are formed in a cylindrical shape through copper plating, and an upper surface 40A of the respective conductive posts 40 is exposed from an upper surface 50A of the molding unit 50, while the lower surface 40B of the respective conductive posts 40 is exposed from the lower surface 50B of the molding unit 50. Here, the cylindrical conductive posts 40 penetrate the molding unit 50. The conductive posts 40 correspond to the through electrode portions of the present invention.

In the present embodiment, a film 40C formed through nickel plating, gold plating or the like is coated on an upper surface 40A and lower surface 40B of the respective conductive posts 40, as needed.

Next, a manufacturing method of the semiconductor package 10 is described with reference to FIG. 3 through FIG. 16. In the manufacturing process of the semiconductor package 10, a semiconductor chip holding process is first carried out as shown in FIG. 3.

Figure 3:
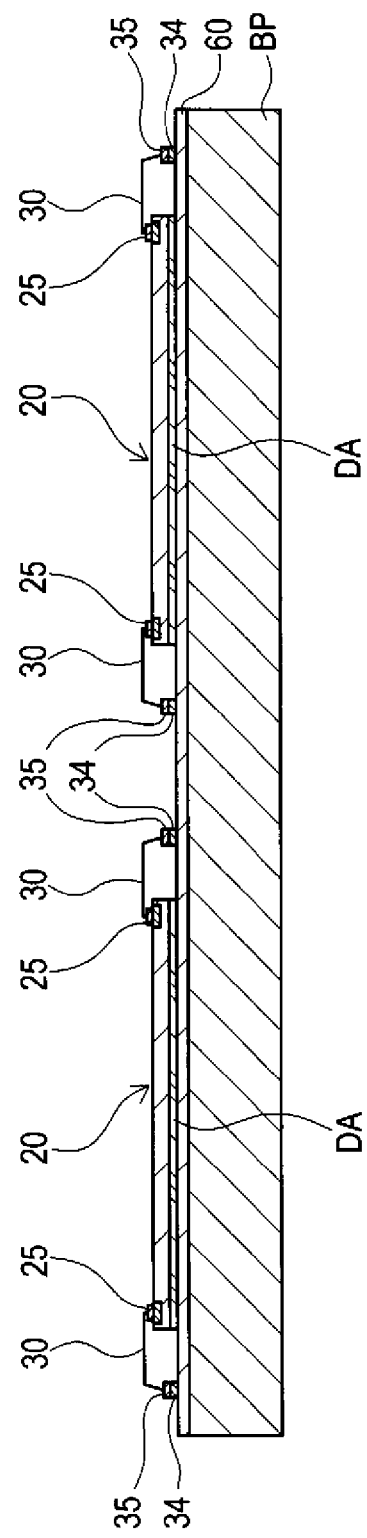
FIG. 3 is an explanatory diagram of a semiconductor chip holding process according to one embodiment of the present invention.

In the semiconductor chip holding process according to FIG. 3, an aluminum vapor-deposited film 60 is formed on an upper surface of a base plate BP. Here, an aluminum plate is used as a base plate BP. Then, a die attachment DA is formed on an upper surface of the aluminum vapor-deposited film 60. Here, the die attachment DA is formed of a thermosetting epoxy resin. In one embodiment, the height of the die attachment DA is 20 μm to 30 μm.

In the semiconductor chip holding process, metal bumps 34 and the above-described lead wire connecting electrodes (35A through 35L) are stacked on an upper surface of the aluminum vapor-deposited film 60. Metal bumps 34 and the lead wire connecting electrodes 35 can be formed through electrolytic plating, for instance. Here, the metal bumps 34 and the lead wire connecting electrodes 35 are formed of gold (Au). The height of the metal bumps 34 and the lead wire connecting electrodes 35 is 20 μm through 30 μm, respectively.

The die attachment DA is thermally-cured to fix the semiconductor chip 20 to the die attachment DA. The lead wire connecting electrodes 35 (35A through 35L) are respectively wire-bonded with the metal bumps 25 of the semiconductor chip 20 through lead wires 30 provided therein between.

Figure 4:
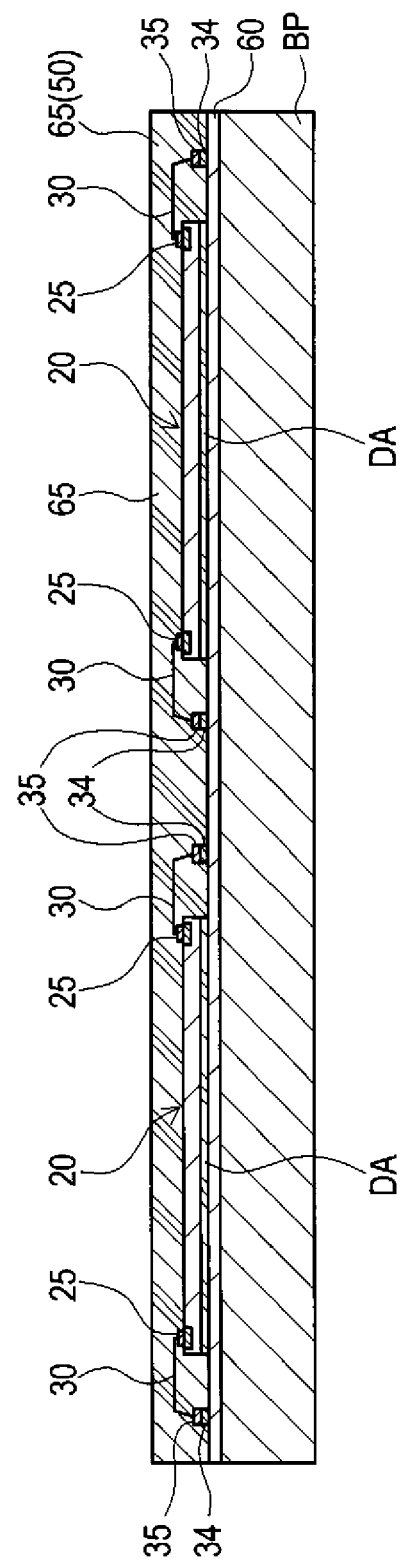
FIG. 4 is an explanatory diagram of a photosensitive resin coating process according to one embodiment of the present invention.

After the semiconductor chip holding process, a photosensitive resin coating process is carried out as shown in FIG. 4. In the photosensitive resin coating process according to FIG. 4, a photoresist is coated on the base plate BP by spin-coating onto which the semiconductor chip 20, lead wires 30, metal bumps 34 and lead wire connecting electrodes 35 (35A through 35L) are respectively mounted. As a result, a resist film 65 is formed on an upper surface of the base plate BP. The resist film 65 forms the above-described molding unit 50.

Figure 5:
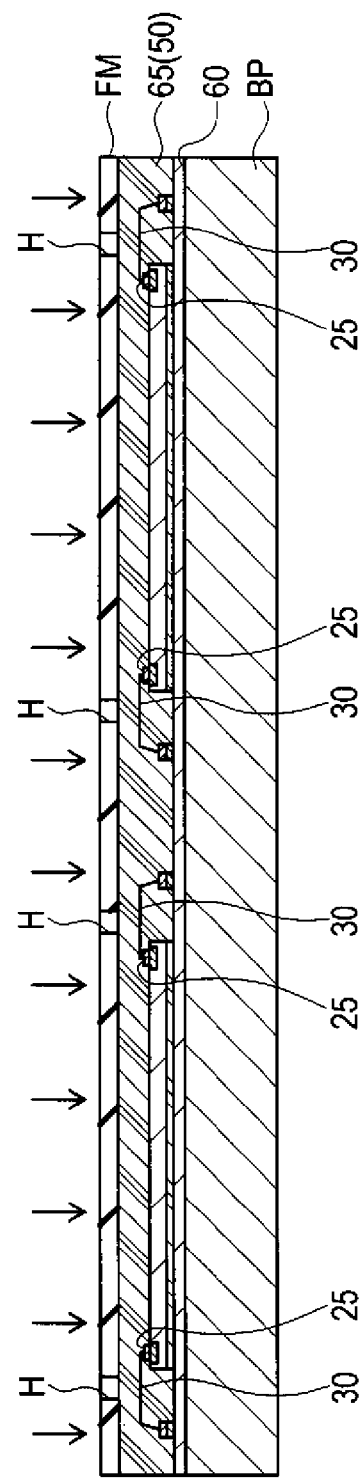
FIG. 5 is a first explanatory diagram of an exposure process according to one embodiment of the present invention.

After the photosensitive resin coating process, an exposure process is carried out as shown in FIG. 5. In the exposure process of FIG. 5, a photo mask FM is deposited on an upper surface of the resist film 65. The photo mask FM according to the present embodiment is formed with twelve circular openings H defined therein, the number of which corresponds to the number of the above-described conductive posts 40.

Figure 6:
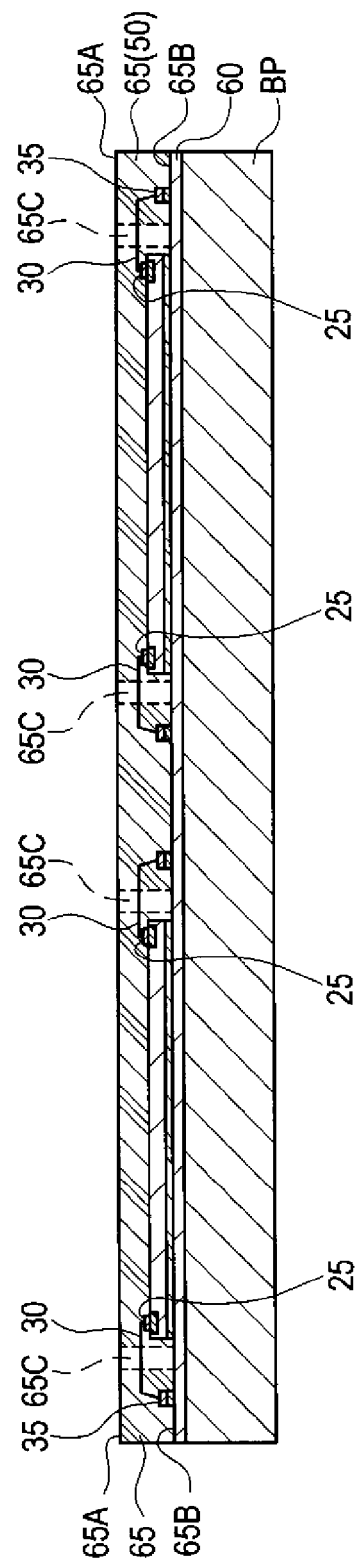
FIG. 6 is a second explanatory diagram of the exposure process according to one embodiment of the present invention.

In the exposure process, the resist film 65 is exposed to ultraviolet rays through the photo mask FM. The ultraviolet rays pass through the above-described circular openings H. Here, the ultraviolet rays are projected onto the resist film 65 at portions facing opposite to the openings H. As shown in FIG. 6, the ultraviolet rays are projected onto circular portions 65C extending from an upper surface 65A of the resist film 65 to the lower surface 65B of the resist film 65. Lead wires 30 used to wire-bond the above-described metal bumps 25 with the respective lead wire connecting electrodes 35A through 35L are respectively passed through the circular portions 65C.

Figure 7:
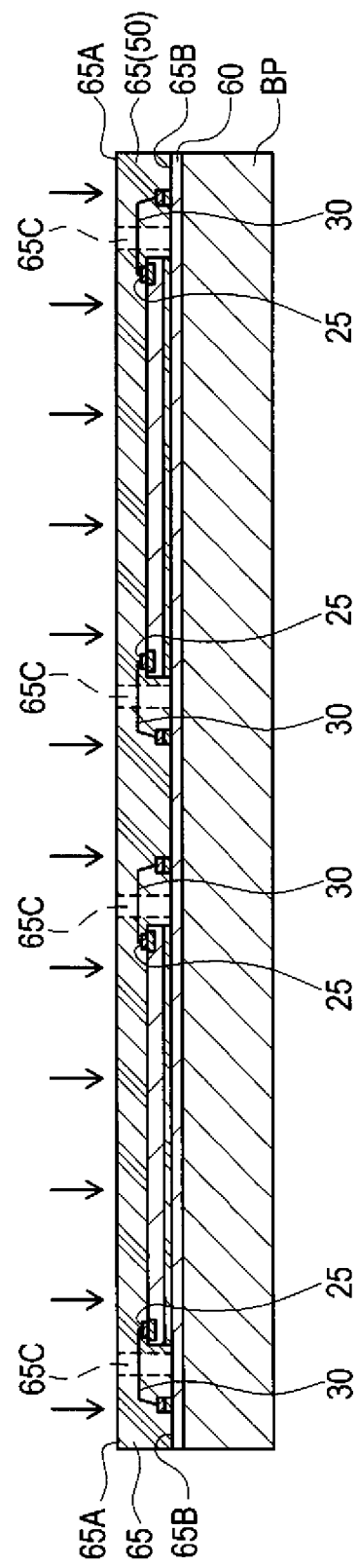
FIG. 7 is a first explanatory diagram of a development process according to one embodiment of the present invention.
Figure 8:
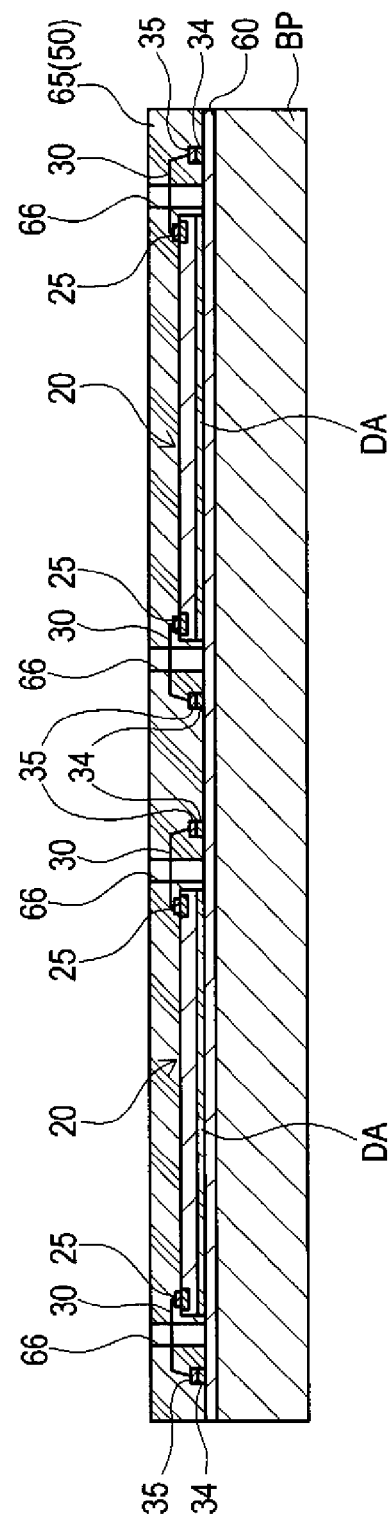
FIG. 8 is a second explanatory diagram of the development process according to one embodiment of the present invention.

After the exposure process, a development process is carried out as shown in FIG. 7. In the development process of FIG. 7, a developing solution, for instance, is sprayed on the resist film 65. Here, the above-described circular portions 65C are dissolved by the developing solution. At the portions where the circular portions 65C have dissolved, through holes 66 are formed as shown in FIG. 8. In the present embodiment illustrated in FIG. 8, twelve cylindrical portions 65C are formed in the twelve circular openings H, respectively. Twelve through holes 66 are formed at portions where the twelve cylindrical portions 65C are dissolved. Lead wires 30 cut across the inner side of the through holes 66 in a radial direction of the though holes 66.

Figure 9:
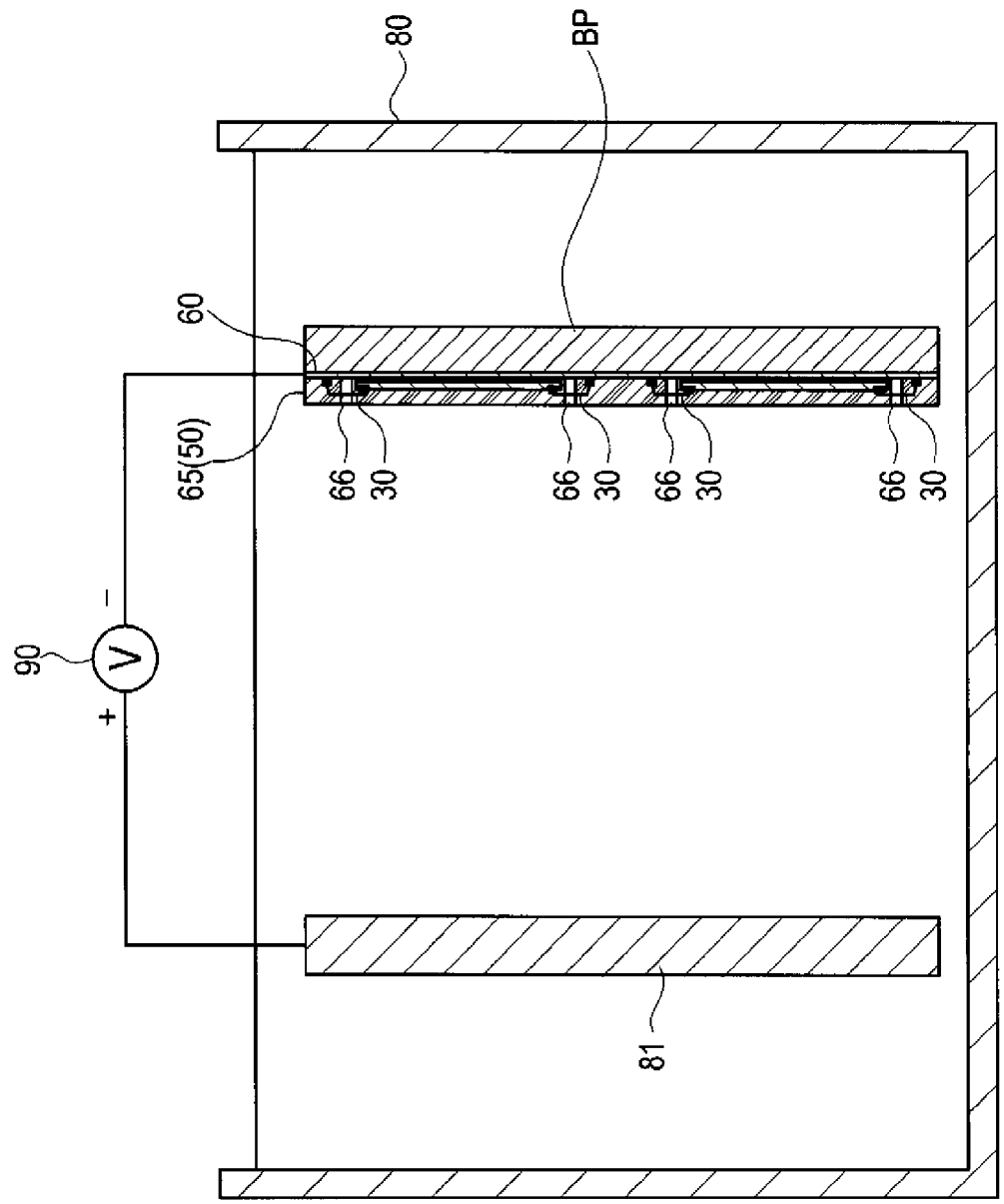
FIG. 9 is a first explanatory diagram of a conductive post forming process according to one embodiment of the present invention.

After the developing process, a conductive post forming process is carried out as shown in FIG. 9. In the conductive post forming process as shown in FIG. 9, the above-described conductive posts 40 are formed through electrolytic plating. In the conductive post forming process, a plating bath 80 is filled with a copper sulfate aqueous solution, for instance, as a plating solution. Copper electrodes 81, as anodes, and the aluminum vapor-deposited film 60 contacting the above-described through holes 66, as cathode, are immersed in the copper sulfate aqueous solution.

Figure 10:
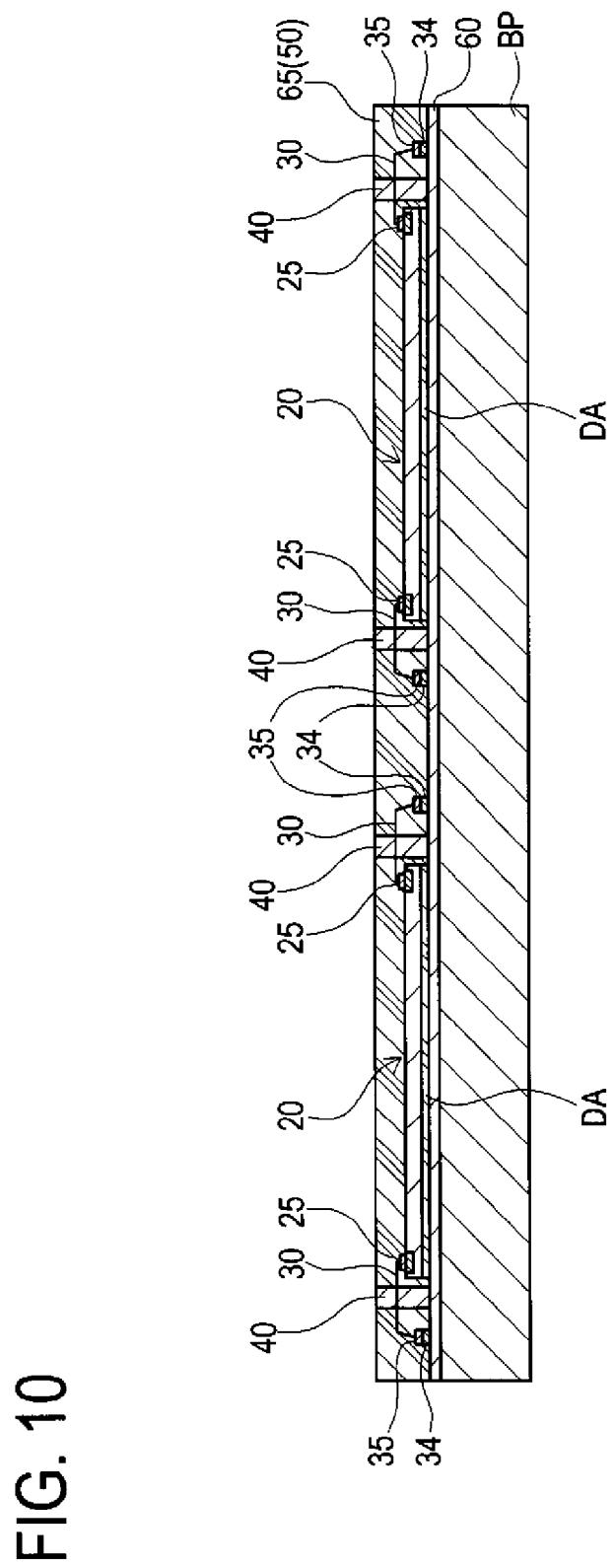
FIG. 10 is a second explanatory diagram of the conductive post forming process according to one embodiment of the present invention.

When an electrical current is passed from power source 90 to the copper electrodes 81 and the aluminum vapor-deposited film 60, copper ions inside the copper sulfate aqueous solution move towards the aluminum vapor-deposited film 60. Copper from the aluminum vapor-deposited film 60 is thus fixed towards the through holes 66, whereby copper-plated portions are formed. The shape of the copper-plated portions is made cylindrical to thus match the shape of the through holes 66. The cylindrical copper-plated portions form the conductive posts 40 as shown in FIG. 10. Lead wires 30 cutting across the through holes 66 are embedded in the conductive posts 40. The cylindrical copper-plated portions correspond to the columnar conducting units.

Figure 11:
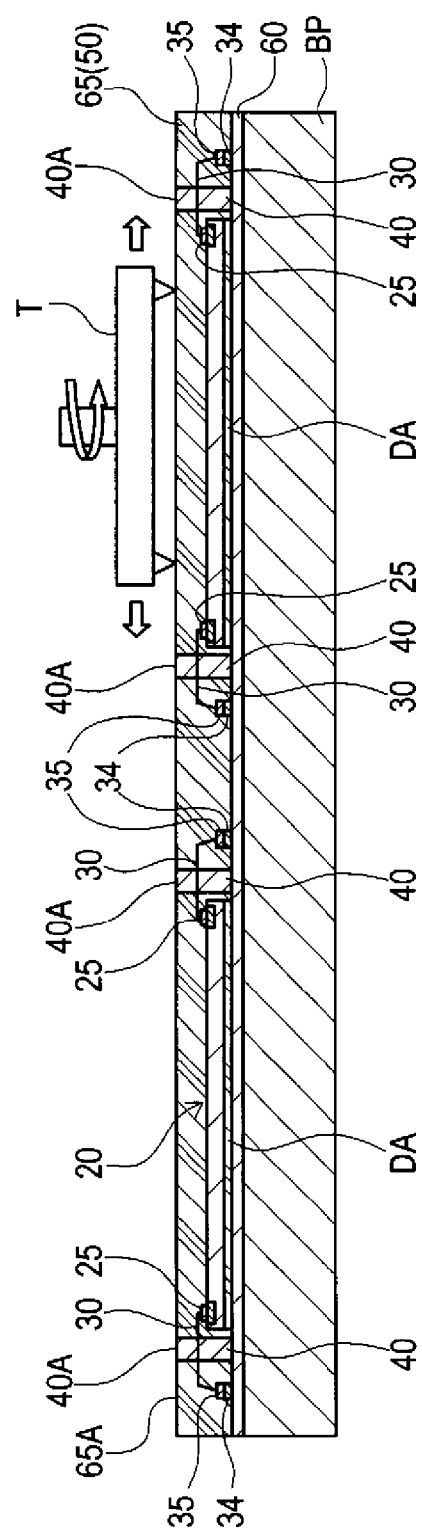
FIG. 11 is an explanatory diagram of a molding process according to one embodiment of the present invention.

After the conductive post forming process, a molding process is carried out as shown in FIG. 11. In the molding process, the thickness of the resist film 65 is adjusted to a predetermined size. In the molding process, the upper surface 65A of the resist film 65 and the upper surface of the conductive posts 40 are ground by a diamond wheel rotated at high velocity. As a result, the upper surface 65A of the resist film 65 and the upper surface 40A of the respective conductive posts 40 is flattened, thereby exposing the upper surface 40A of the conductive posts 40 from the upper surface 65A of the resist film 65.

Figure 12:
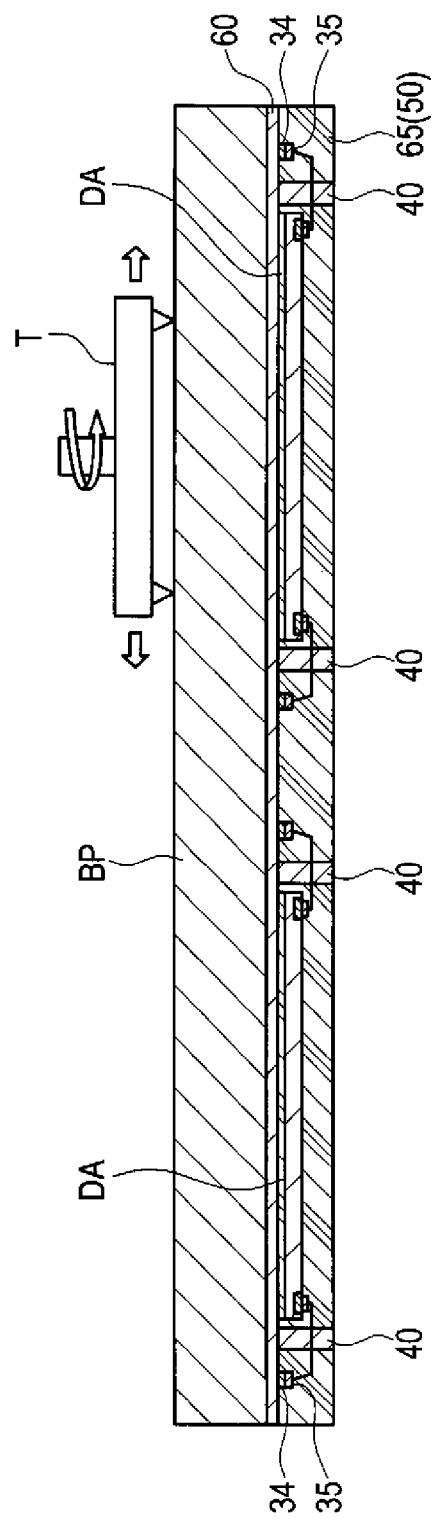
FIG. 12 is a first explanatory diagram of a grinding process according to one embodiment of the present invention.
Figure 13:
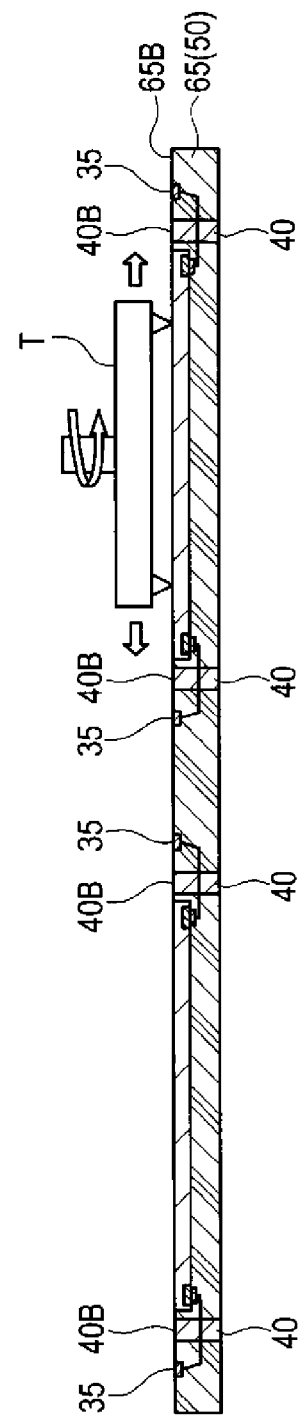
FIG. 13 is a second explanatory diagram of the grinding process according to one embodiment of the present invention.

After the molding process, a grinding process is carried out as shown in FIG. 12. In the grinding process, the base plate BP is ground from a lower surface towards an upper surface thereof by a diamond wheel T rotated at high velocity. Following the grinding of the base plate BP, a portion of the lower side of the aluminum vapor-deposited film 60, the die attachment DA, the metal bumps 34 and the conductive posts 40 is ground by the diamond wheel T. The lower surface 65B of the resist film 65 and the lower surface 40B of the conductive posts 40 are flattened by the diamond wheel T. As a result, the lower surface 40B of the respective conductive posts 40 is exposed from the lower surface 65B of the resist film 65 as shown in FIG. 13. In addition, the lead wire connecting electrodes 35 (35A through 35L) are respectively exposed from the lower surface 65B of the resist film 65 through grinding using the diamond wheel T.

Figure 14:
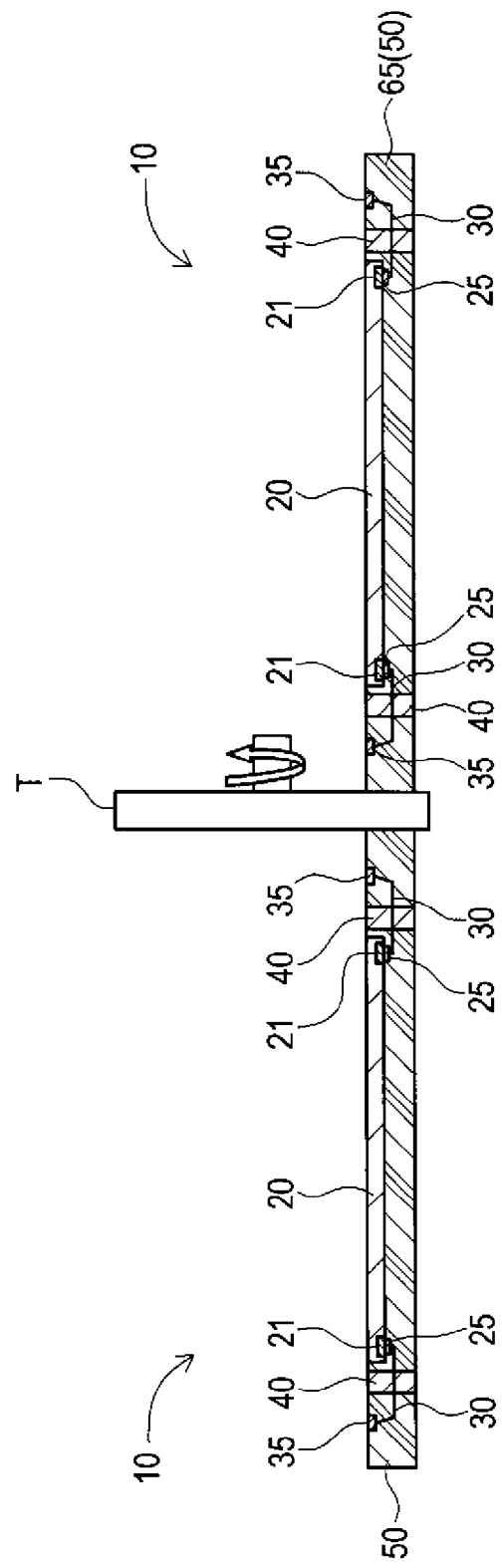
FIG. 14 is a first explanatory diagram of a separating process according to one embodiment of the present invention.
Figure 15:
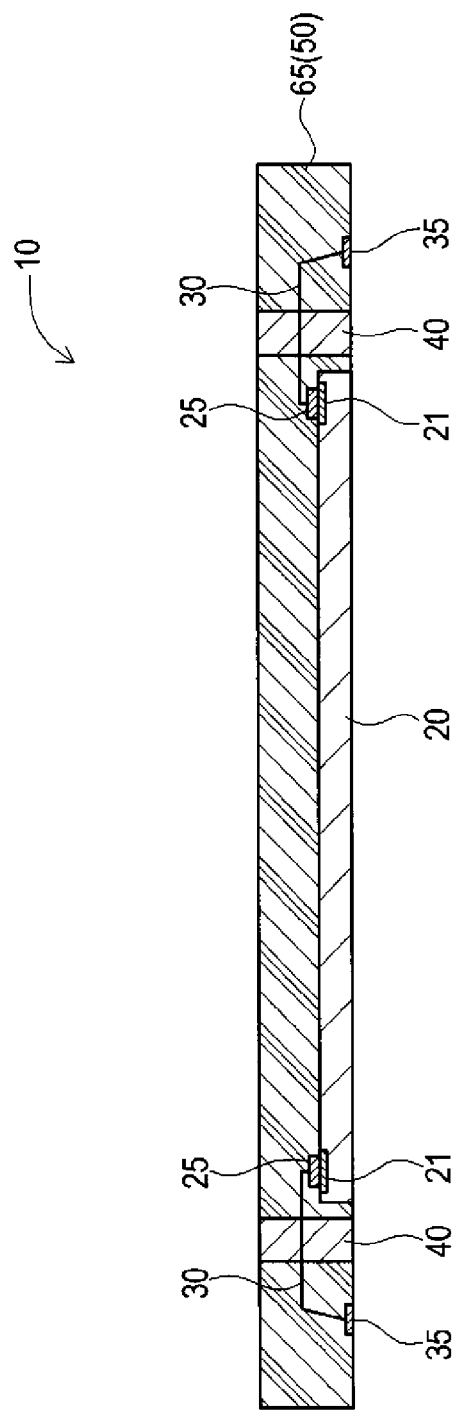
FIG. 15 of a second explanatory diagram of the separating process according to one embodiment of the present invention.

After the grinding process, a separating process is carried out as shown in FIG. 14. In the separating process, two semiconductor packages 10 are separated by means of the diamond wheel T rotating at high velocity. As a result, semiconductor packages 10 of predetermined dimensions are formed as shown in FIG. 15.

Figure 16:
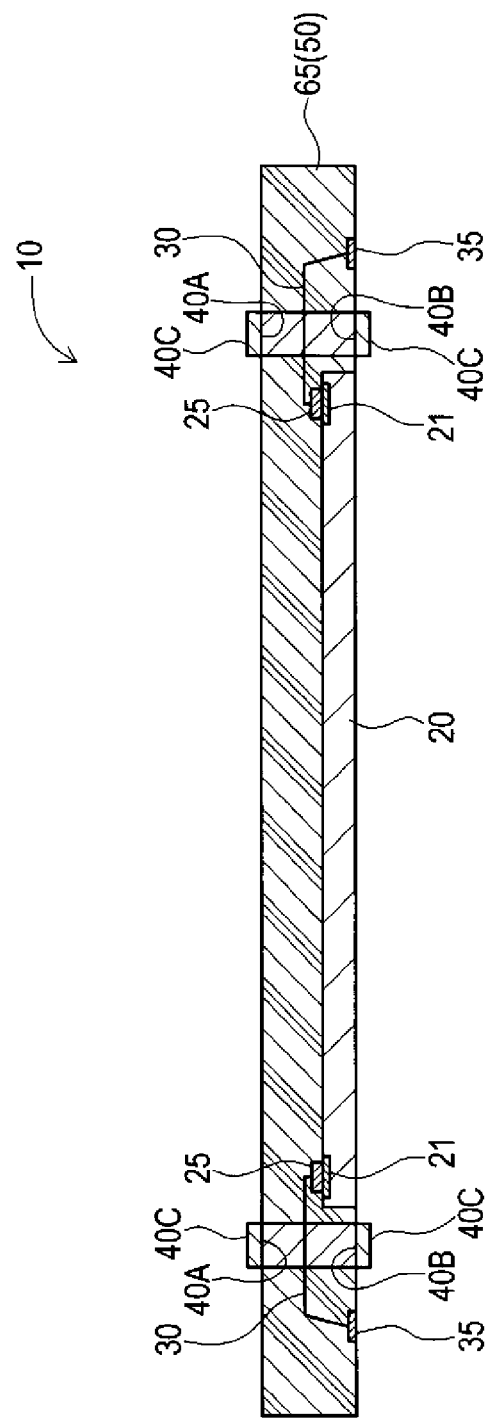
FIG. 16 is an explanatory diagram of a conductive post exposed surface treating process according to one embodiment of the present invention.

Subsequently, a conductive post exposed surface treating process is carried out as shown in FIG. 16, as needed. In the conductive post exposed surface treating process, a film 40C is formed through nickel plating, gold plating or the like, on either one or both of the upper surface 40A of the conductive posts 40 and the lower surface 40B of the conductive posts 40. The film 40C can be formed through the above-described electrolytic plating, for instance.

In the present embodiment, conductive posts 40 having the lead wires 30 embedded therein are formed in the conductive post forming process, as described in the above text. Accordingly, the conductive post forming process of forming conductive posts 40 with the lead frames 30 embedded therein corresponds to the step of forming the through electrode unit of the present invention.

In the present embodiment, the upper surface 40A of the conductive posts 40 is exposed from the upper surface 65A of the resist film 65 in the molding process, as described in the above text. In addition, the lower surface 40B of the conductive posts 40 is exposed from the lower surface 65B of the resist film 65 in the grinding process, as described in the above text. Accordingly, the molding process of exposing the upper surface 40A of the conductive posts 40 from the upper surface 65 of the resist film 65 and the grinding process of exposing the lower surface 40B of the conductive posts 40 from the lower surface 65B of the resist film 65 correspond to the step of forming the through electrode unit of the present invention.

According to the semiconductor package 10 and its manufacturing method of the present embodiment, the lead wires 30 connected to the respective metal bumps 25 of the semiconductor chip 20 are embedded in the respective conductive posts 40, and an upper surface 40A of the conductive posts 40 is exposed from the upper surface 65A of the resist film 65, whereas the lower surface 40B of the conductive posts 40 is exposed from the lower surface 65B of the resist film 65.

An electrical test of the semiconductor chip 20 can thus be carried out from the upper surface 65A of the resist film 65 and the lower surface 40B of the resist film 65, through the upper surface 40A and the lower surface 40B of the respective conductive posts 40 electrically connected to the respective metal bumps 25 of the semiconductor chip 20.

In another embodiment, electrical testing of the semiconductor chip 20 can be carried out from both surfaces (upper surface 65A and lower surface 65B) of the resist film 65, thereby making it possible to broaden the range of electrical testing procedures and make electrical testing easier as compared to the conventional methods. In a still further embodiment, by forming the conductive posts 40 that comprise lead wires 30 penetrating them in a radial direction thereof through electrolytic plating (copper plating unit), the mechanical stress applied to the fine wires such as the lead wires 30 at the time of forming the conductive posts 40 can be suppressed.

Furthermore, disconnection of the lead wires 30 can be prevented by suppressing the mechanical stress applied to the lead wired 30. Moreover, by preventing disconnection of the respective lead wired 30, conductivity between the semiconductor chip 20 and the conductive posts 40 can be reliably secured. Also, since the conductive posts 40 can be formed through electrolytic plating which is a common technology, a particular technology is not required for forming the conductive posts 40. By forming the conductive posts 40 using a common technology, it is possible to prevent an increase in the manufacturing cost of the semiconductor package 10.

According to the present embodiment, even if semiconductor chips 20 are damaged upon being packaged in the semiconductor package 10, the number of damaged semiconductor chips 20 can be suppressed to a minimum, unlike the case in which the MCP structure comprising a plurality of semiconductor chips 20 mounted in a single semiconductor package 10 is used. Thus, the number of semiconductor chips 20 that are discarded due to damage caused at the time of packaging can be minimized, thereby suppressing a drop in the manufacturing yield of the semiconductor package 10 comprising semiconductor chips 20 mounted therein.

In one embodiment, a film 40C is formed through nickel plating, gold plating or the like on either one of or both the upper surface 40A and the lower surface 40B of the conductive posts 40. An oxide film can be prevented from being formed on either one or both of an upper surface 40A and a lower surface 40B of the conductive posts 40 by coating a film 40C thereon, thereby improving the corrosion resistance of the conductive posts 40. Also, according to the present invention, by preventing an oxide film from being formed on either one of or both an upper surface 40A and the lower surface 40B of the conductive posts 40 through coating a film 40C thereon, it is possible to facilitate bonding of solder to the semiconductor posts 40 and improve the condition of the solder.

The provision of lead wire connecting electrodes 35 (35A through 35L) that are connected to the lead wires 30 and are exposed from the lower surface 65B of the resist film 65 makes it possible to secure portions which become conductive with the metal bumps 25 of the semiconductor chip 20 through the lead wires 30, separately from the above-described conductive posts 40. By providing the lead wire connecting electrodes 35 (35A through 35L) results in a plurality of portions that are made conductive with the metal bumps 25 of the semiconductor chip 20. Provision of a plurality of portions that are made conductive with the metal bumps 25 of the semiconductor chip 20 makes it possible to diversify the connection methods to the metal bumps 25 of the semiconductor chip 20.

In further embodiments, the surface area at which the upper surface 40A of the respective conductive posts 40 is exposed from the upper surface 65A of the resist film 65 and the surface area at which the lower surface 40B of the respective conductive posts 40 is exposed from the lower surface 65B of the resist film 65 are respectively larger than the surface area at which the lead wire connecting electrodes 35 (35A trough 35L) are exposed from the lower surface 65B of the resist film 65.

The surface area of the upper surface 40A and the surface area of the lower surface 40B of the respective conductive posts 40 which are brought into contact with the electrical testing device of the semiconductor chip 20 can be made larger than the surface area at which the lead wire connecting electrodes 35 (35A through 35L) are exposed. Thus, according to the present embodiment, by making the surface area of the upper surface 40A and the surface area of the lower surface 40B of the respective conductive posts 40 which are brought into contact with the electrical testing device of the semiconductor chip 20 larger than the surface area at which the lead wire connecting electrodes 35 (35A through 35L) are exposed, faulty contact with the electrical testing device can be suppressed.

Accordingly, according to the semiconductor package 10 and its manufacturing method of the present embodiment, faulty contact of the electrical testing device with respect to the conductive posts 40 can be suppressed, thereby making it possible to carry out reliable electrical testing of the semiconductor chip 20.

Second Embodiment

Figure 17:
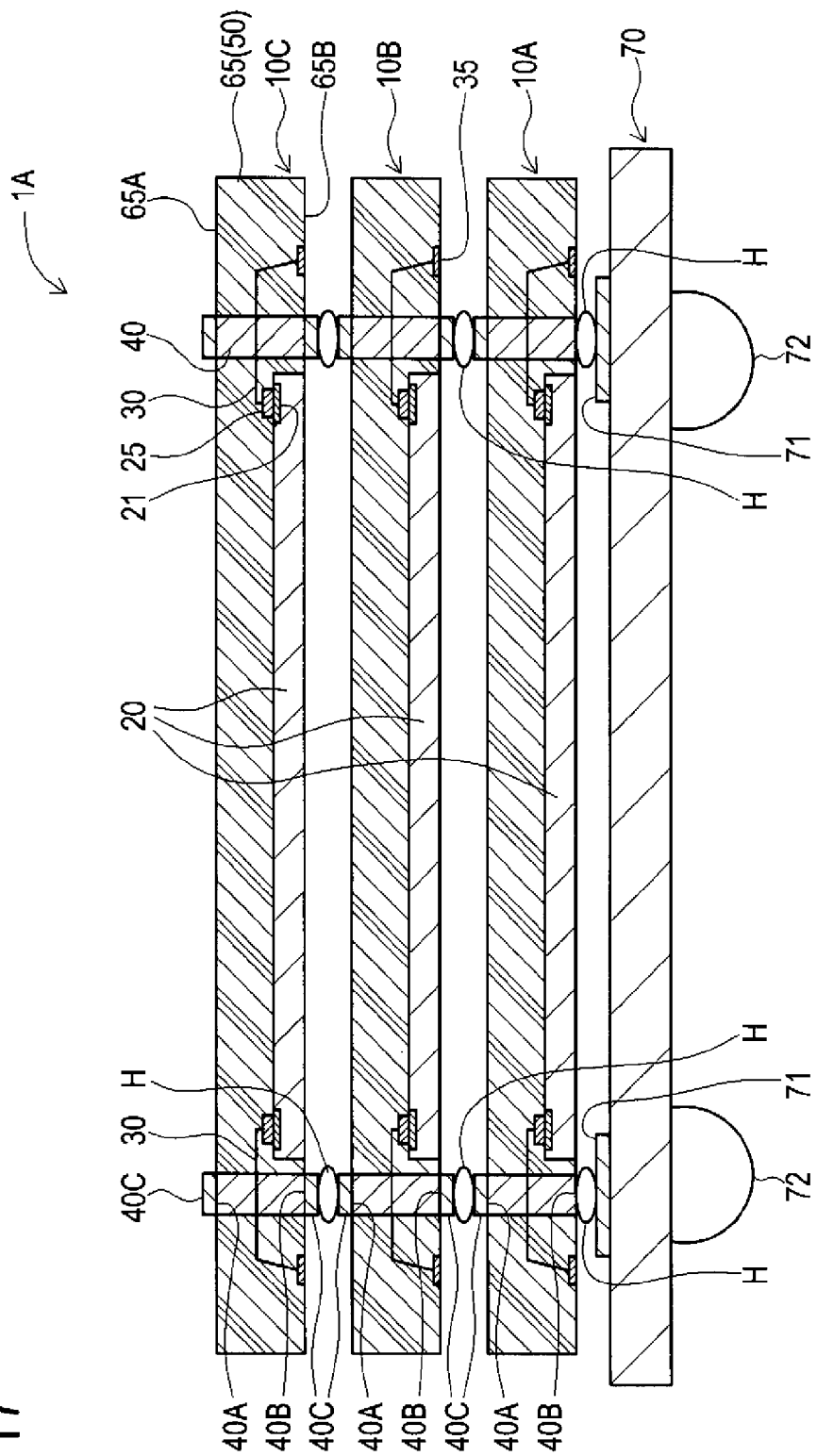
FIG. 17 is a schematic cross-sectional diagram of a semiconductor device according to a second embodiment.

A second embodiment of the present invention will be described while referring to FIG. 17. FIG. 17 is a schematic cross-sectional view of a semiconductor device according to the second embodiment. Here, elements which are identical to those in the first embodiment are denoted by the same numerical symbols and further description thereof is hereby omitted. The semiconductor device 1 of the second embodiment comprises the above-described semiconductor package 10 and a motherboard 70.

The motherboard 70 has wiring patterns 71 formed on an upper surface thereof. The motherboard 70 also comprises solder balls 72 mounted on a lower surface thereof.

The lower surface 40B of the respective conductive posts 40 in the semiconductor package 10A is connected to wiring patterns 71 through solder H. The lower surface 40B of the respective conductive posts 40 in the semiconductor package 10B is connected to the upper surface 40A of the respective conductive posts 40 in the semiconductor package 10B, through the film 40C, by means of solder H. The lower surface 40B of the respective conductive posts 40 in the semiconductor package 10C is connected to the upper surface 40A of the respective conductive posts 40 in the semiconductor package 10B, through the film 40C, by means of solder H.

The semiconductor packages 10A through 10C are stacked on the motherboard 70 with the respective conductive posts 40 being made conductive with each other by means of solder H. In the lowermost semiconductor package 10A from amongst the semiconductor packages 10A through 10C stacked in a three-layered configuration, the conductive posts 40 are made conductive with the wiring patterns 71 through solder H.

In the present embodiment, the respective semiconductor packages 10A through 10C may be of different types. For instance, the semiconductor package 10A may be provided with a logical function of a micro-computer, while the semiconductor packages 10B and 10C may be provided with a memory function.

In the present embodiment, the upper surface 40A of the respective conductive posts 40 exposed from the upper surface 65A of the resist film 65 corresponds to the first exposed surface of the present invention. Also, in the present embodiment, the lower surface 40B of the respective conductive posts 40 exposed from the lower surface 65B of the resist film 65 corresponds to the second exposed surface of the present invention.

In the semiconductor device 1 of the present embodiment, the lower surface 40B of the respective conductive posts 40 in the semiconductor package 10B is fixed to the upper surface 40A of the respective conductive posts 40 in the semiconductor package 10A through the film 40C, by means of solder H. Further, in the semiconductor device 1 of the present embodiment, the upper surface 40A of the respective conductive posts 40 in the semiconductor package 10B is fixed to the lower surface 40B of the respective conductive posts 40 in the semiconductor package 10C through the film 40C, by means of the solder H. As a result, in the semiconductor device 1 of the present embodiment, the semiconductor packages 10A through 10C are stacked in a three-layered configuration in which the semiconductor package 10C is arranged at the upper side of the semiconductor package 10B, the semiconductor package 10A is arranged at a lower side of the semiconductor package 10B.

Further, in the lowermost semiconductor package 10A from amongst the semiconductor packages 10A through 10C stacked in a three-layered configuration, the lower surface 40B of the respective conductive posts 40 in the semiconductor package 10A is fixed to the wiring patterns 71 through solder H. Here, according to the semiconductor device 1 of the present embodiment, a conductive path can be secured which extends from the wiring patterns 71 of the motherboard 70 through the conductive posts 40 of the lowermost semiconductor package 10A to the conductive posts 40 of the stacked semiconductor packages 10A through 10C by using the conductive posts 40 of the respective semiconductor packages 10A through 10C.

According to the semiconductor device 1 of the present embodiment, stacking the three semiconductor packages 10A through 10C while securing a conductive path with respect to the these semiconductor packages 10A through 10C makes it possible to improve the packaging density of the semiconductor package, thereby contributing to a further miniaturization of the semiconductor device 1.

In one embodiment, stacking the different types of semiconductor packages 10A through 10C in a three-layered configuration can help provide a plurality of functions in the semiconductor device 1, thereby contributing to obtaining a high-performance semiconductor device 1.

In some embodiments, the surface area of the upper surface 40A of the respective conductive posts 40 and the surface area of the lower surface 40B of the respective conductive posts 40 is made larger than the surface area at which the lead wire connecting electrodes 35 (35A through 35L) are exposed from the lower surface 65 of the resist film 65. By making the surface area of the upper surface 40A and the surface area of the lower surface 40B of the respective conductive posts 40 larger than the exposed surface area of the lead wire connecting electrodes 35 (35A through 35L), a surface area for attaching the solder H through the film 40C can be effectively secured. Thus, according to the semiconductor device 1 of the present embodiment, by effectively securing a surface area for attaching the solder H, it is possible to maintain the conductive path extending from the wiring patterns 71 of the motherboard 70 to the conductive posts 40 of the stacked semiconductor packages 10A through 10C in an excellent conductive state by using the solder H.

According to the semiconductor device 1 of the present embodiment, a film 40C is formed on either one of or both the upper surface 40A and lower surface 40B of the conductive posts 40, thereby improving, as described in the above, the corrosion resistance of the conductive posts 40 and the condition of the solder (e.g., the ability for the solder to liquidize) with respect to the conductive posts 40. Accordingly, the conductive state of the conductive path extending from the wiring patterns 71 of the motherboard 70 to the conductive posts 40 of the stacked semiconductor packages 10A through 10 is improved.

According to the semiconductor device 1 of the present embodiment, by improving the conductive state of the conductive path, it possible to stabilize the operation in the semiconductor device and thus improve reliability of the semiconductor device.

Third Embodiment

Figure 18:
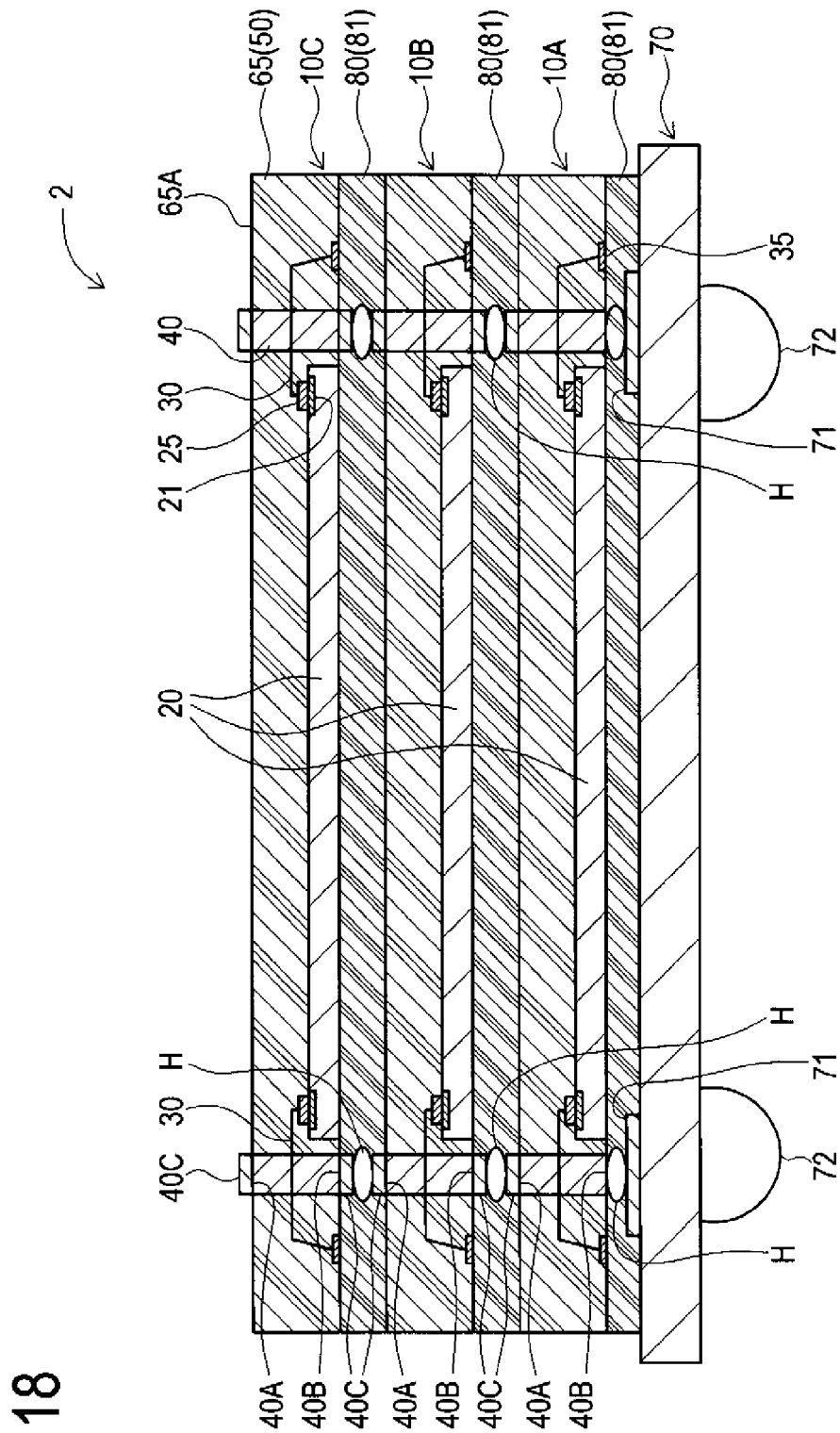
FIG. 18 is a schematic cross-sectional diagram of a semiconductor device according to a third embodiment.

A third embodiment of the present invention will be described while referring to FIG. 18. FIG. 18 is a schematic cross-sectional view showing a semiconductor device of the third embodiment. Here, elements which are identical with those of embodiment 1 and embodiment 2 are denoted by identical numerical symbols and further description thereof is hereby omitted. The semiconductor device 2 of the third embodiment is provided with an adhesive layer 80 in addition to the semiconductor package 10 similar to that of the second embodiment and the motherboard 70 similar to that of the second embodiment.

In the present embodiment, a thermosetting epoxy-type adhesive 81 is filled between the upper surface of the motherboard 70 and the lower surface of the semiconductor package 10A, between the upper surface of the semiconductor package 10A and the lower surface of the semiconductor package 10B and between the upper surface of the semiconductor package 10B and the lower surface of the semiconductor package 10C, respectively.

In the semiconductor device 2, the semiconductor packages 10A through 10C are integrated by filling the above-described thermosetting epoxy-type adhesive 81 between the upper surface of the semiconductor package 10A and the lower surface of the semiconductor package 10B and between the upper surface of the semiconductor package 10B and the lower surface of the semiconductor package 10C. In addition, the integrated semiconductor packages 10A through 10C are integrated with the motherboard 70 through the thermosetting epoxy-type adhesive 81 filled between the lower surface of the lowermost semiconductor package 10A and the upper surface of the motherboard 70. The three stacked semiconductor packages 10A through 10C are made integral with each other through the adhesive layer 80, thereby allowing the three semiconductor packages 10A through 10C to be firmly fixed to each other, and thus improve the strength of the semiconductor device 2 against impacts.

Furthermore, by integrating the motherboard 70 with the lowermost semiconductor package 10A by means of the adhesive layer 80, in addition to fixing the three semiconductor packages 10A through 10C to each other, the mother board 70 and the lowermost semiconductor package 10A can be firmly fixed. In addition, by firmly fixing the motherboard 70 and the lowermost semiconductor package 10A, in addition to fixing the three semiconductor packages 10A through 10C to each other, the strength of the semiconductor device 2 with respect to impacts can be improved.

Figure 19:
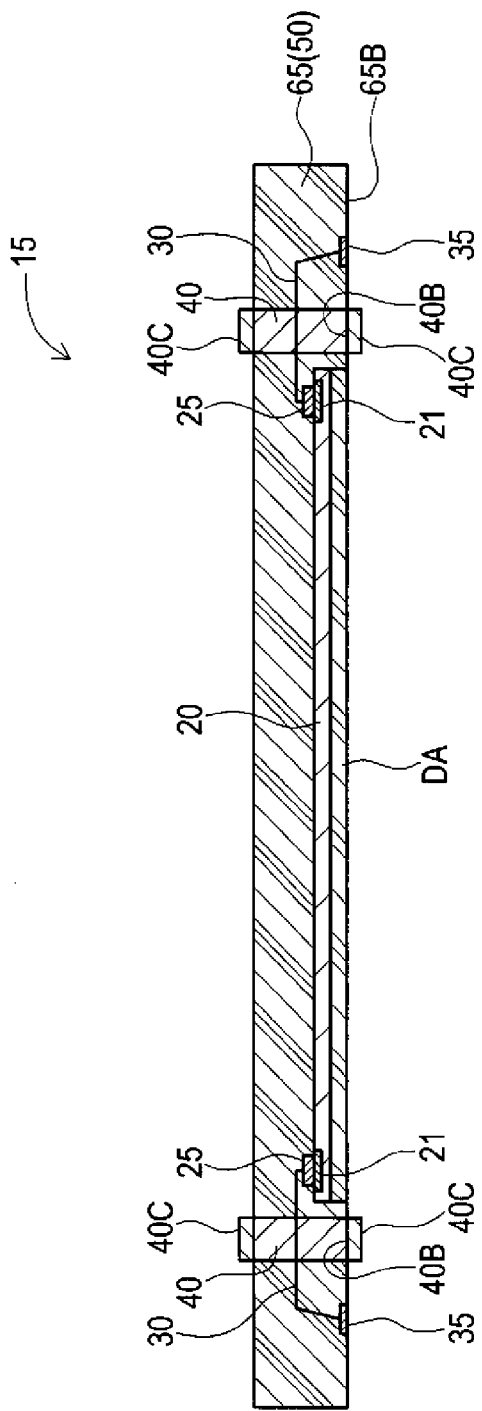
FIG. 19 is a schematic cross-sectional diagram of a semiconductor package according to a fourth embodiment.

The present invention is not limited to the particular embodiments shown herein and various changes and modifications are made to the disclosed embodiments without departing from the spirit and scope of the invention. Unlike the above-described first embodiment, the lower surface 65B of the resist film 65 may be formed to be respectively coplanar with the lower surface of the die attachment DA, the lower surface of the lead wire connection electrodes 35 and the lower surface 40B of the conductive posts 40, as shown in the semiconductor package 15 of FIG. 19. In FIG. 19, elements which are identical to those of FIG. 16 are denoted by the same numerical symbols.

Figure 20:
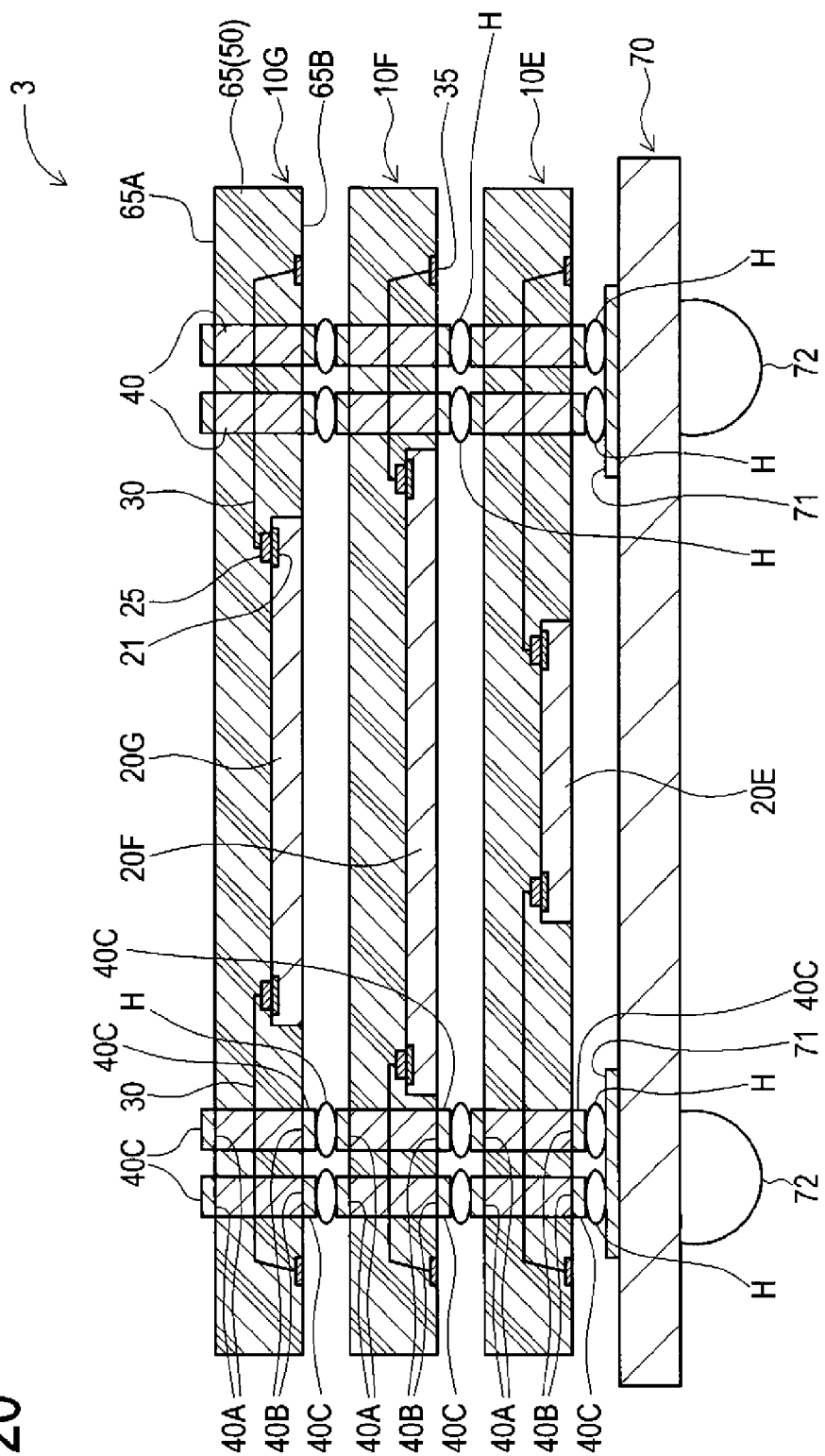
FIG. 20 is a schematic cross-sectional diagram of a semiconductor device according to a fifth embodiment.

In alternate embodiments, the semiconductor packages 10E through 10G respectively comprising semiconductor chips 20E through 20F which differ in size from each other may be stacked on the motherboard 70 as shown in the semiconductor device 3 illustrated in FIG. 20. In FIG. 20, elements which are identical to those of FIG. 17 are denoted by the same numerical symbols.

Figure 21:
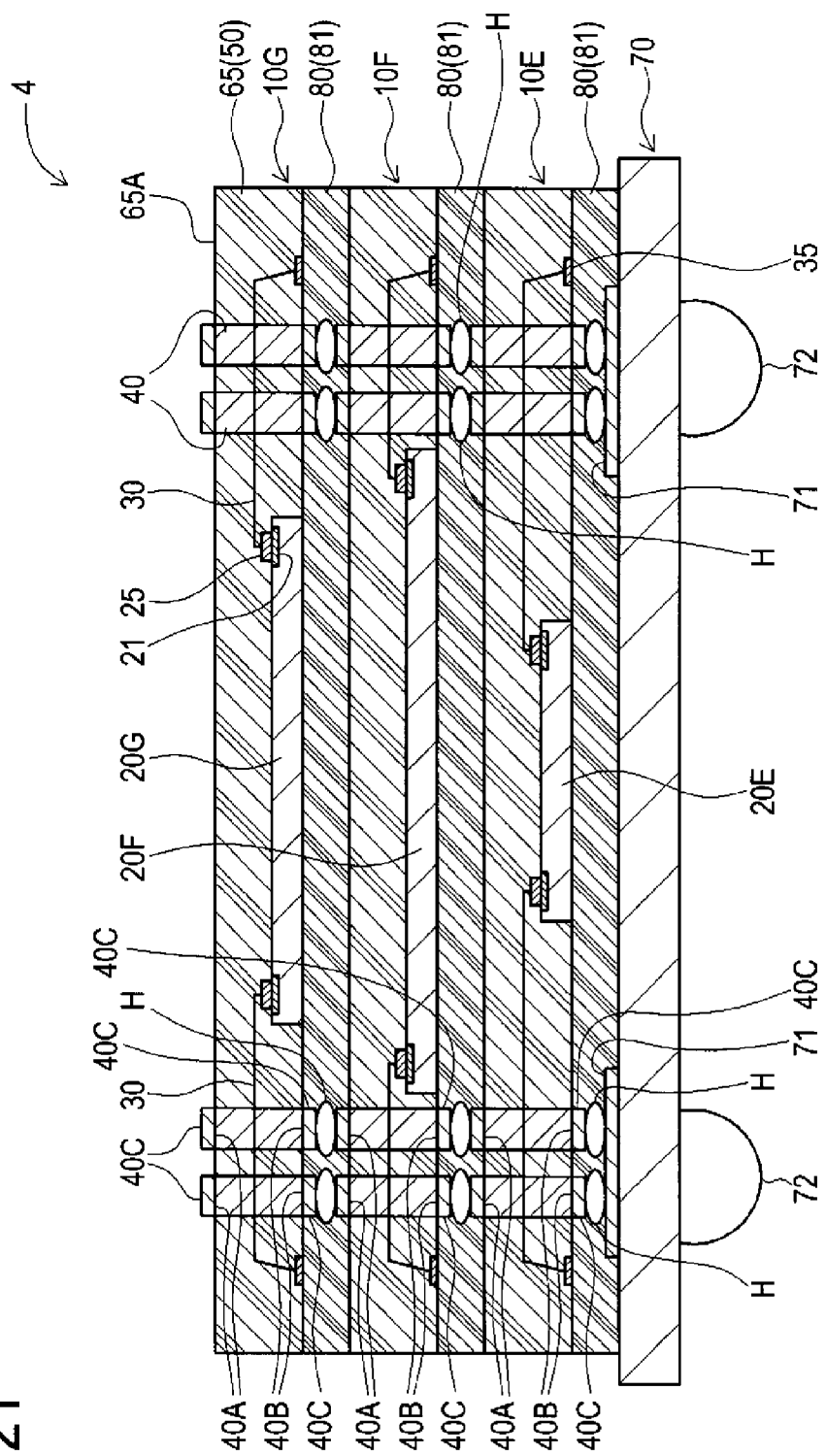
FIG. 21 is a schematic cross-sectional diagram of a semiconductor device according to a sixth embodiment.

As shown in the semiconductor device 4 illustrated in FIG. 21, the above-described semiconductor packages 10E through 10G may be integrated through the above-described adhesive layer 80, and the semiconductor packages 10E through 10G may be integrated with the motherboard 70. In FIG. 21, elements which are identical to those shown in FIG. 18 and FIG. 20 are denoted by the same numerical symbols.

In addition, the semiconductor device is not limited to a POP (Package-on-package) structure as described in the above embodiments, but may also employ an MCP structure as shown in the semiconductor device 5 illustrated in FIG. 22.

In the semiconductor device 5, the semiconductor package 10A is attached to the upper surface of the motherboard 70 by the above-described adhesive layer 80. The semiconductor package 10B is attached to the semiconductor package 10A arranged at the lower side of the semiconductor package 10B, through a spacer S1 having an adhesive layer 80 on an upper surface and lower surface thereof, respectively. The semiconductor package 10C is attached to the semiconductor package 10B arranged at a lower side of the semiconductor package 10C through a spacer S2 having an adhesive layer 80 on an upper surface and lower surface thereof, respectively. The semiconductor packages 10A through 10C are stacked in a three-layered configuration.

The lead wire connecting electrodes 35 (35A through 35L) of the semiconductor packages 10A through 10C are adapted for wire bonding with the wiring patterns 75 of the motherboard 70 by using Au (gold) wires 31. The numerical symbols 32 in the drawings denote solder balls. Then, Au (gold) wires 31, semiconductor packages 10A through 10C, spacer S1 and spacer S2 are respectively sealed by a molding resin 85. As a result, a semiconductor device 5 is formed as a package comprising semiconductor packages 10A through 10C stacked therein. In FIG. 22, elements that are identical with those in FIG. 18 are denoted by the same numerical symbols.

In the semiconductor device 5, the lead wire connecting terminals 35 (35A through 35L) of the respective semiconductor packages 10A through 10C are made conductive with the wiring patterns 75 of the motherboard 70 by using the Au wires 31. The paths that connect the metal bumps 25 of the semiconductor chip 20 to the wiring patterns 75 through the respective lead wire connecting electrodes 35 (35A through 35L) can be diversified by changing the wiring path of the Au wires 31.

Diversifying the path connecting the metal bumps 25 of the semiconductor chip 20 to the wiring patterns 75 makes it possible to enhance the degree of freedom for wiring the Au wires 31. Although in the above-described embodiment, the conductive posts 40 are formed through copper plating, the conductive posts 40 may also be formed by using metals other than copper.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A semiconductor package comprising:
    a molding unit that seals a bonding wire connected to an electrode pad of a semiconductor chip,
    a through electrode unit; and
    a bonding wire embedded in the through electrode unit,
    wherein the through electrode unit penetrates the molding unit, and
    wherein the upper surface and the lower surface of the electrode pad are exposed from an upper surface of the molding unit and a lower surface of the molding unit.

2. The semiconductor package according to claim 1, wherein:
    the through electrode unit comprises a columnar conducting unit that penetrates the molding unit;
    the through electrode unit comprises a columnar part formed with electrolytic plating; and
    the inside of the columnar part is cut across by the bonding wire.

3. The semiconductor package according to claim 1, wherein the semiconductor package houses a semiconductor chip.

4. The semiconductor package according to claim 2, wherein an exposed surface of the columnar conducting unit that is exposed from the molding unit is coated with metal plating.

5. The semiconductor package according to claim 2, comprising a wire connecting unit that is connected to the bonding wire and is exposed from the molding unit.

6. The semiconductor package according to claim 4, wherein an exposed surface area of the columnar conducting unit is wider than a surface area of the wire connecting unit.

7. A manufacturing method of a semiconductor package comprising:
    sealing a bonding wire connected to an electrode pad of a semiconductor chip, and
    forming a through electrode unit that embeds therein the bonding wire, wherein
    the through electrode unit penetrates the molding unit, and
    wherein the upper surface and the lower surface of the electrode pad are exposed from an upper surface of the molding unit and a lower surface of the molding unit.

8. The manufacturing method according to claim 7, wherein:
    forming the through electrode unit further comprises forming a columnar conducting unit which penetrates the molding unit,
    the columnar conducting unit has a columnar part formed with electrolytic plating, and
    the inside of the columnar part is cut across by the bonding wire.

9. The manufacturing method according to claim 8, further comprising coating an exposed surface of the columnar conducting unit that is exposed from the molding unit with metal plating.

10. The manufacturing method according to claim 8, further comprising forming a wire connecting unit that is connected to the bonding wire and is exposed from the molding unit.

11. The manufacturing method according to claim 9, wherein an exposed surface area of the columnar conducting unit is wider than a surface area of the wire connecting unit.

12. A semiconductor device comprising:
    a semiconductor package having a molding unit that seals a bonding wire connected to an electrode pad of a semiconductor chip; and
    a through electrode unit that embeds therein the bonding wire and penetrates the molding unit,
    wherein the upper surface and the lower surface of the electrode pad are exposed from an upper surface of the molding unit and a lower surface of the molding unit.

13. The semiconductor device according to claim 12, wherein:
    the through electrode unit comprises a columnar conducting unit that penetrates the molding unit and has a columnar part formed with electrolytic plating; and
    the inside of the columnar part is cut across by the bonding wire.

14. The semiconductor device according to claim 13, wherein a first exposed surface of the columnar conducting unit that is exposed from the upper surface of the molding unit is coated with metal plating.

15. The semiconductor device according to claim 13, wherein a second exposed surface the columnar conducting unit that is exposed from the lower surface of the molding unit is coated with metal plating.

16. The semiconductor device according to claim 13, wherein both of the first exposed surface and the second exposed surface are coated with metal plating.

17. The semiconductor device according to claim 13, comprising a wire connecting unit that is connected to the bonding wire and is exposed from the molding unit.

18. The semiconductor device according to claim 17, wherein an area of the first exposed surface and an area of the second exposed surface are wider than a surface area of the wire connecting unit.

19. The semiconductor device according to claim 17, comprising:
- a motherboard on which a wiring pattern is formed;
- a plurality of semiconductor packages, a semiconductor package stacked by fixing the second exposed surface of the semiconductor package in an upper layer onto the first exposed surface of the semiconductor package in a lower layer, and
- wherein the second exposed surface of the semiconductor package in a lowermost layer amongst the plurality of the semiconductor package stacked is fixed onto the wiring pattern.

20. The semiconductor device according to claim 19,
- wherein the plurality of the semiconductor package are adhered to each other, and
- wherein the motherboard and the semiconductor package in the lowermost layer are adhered to each other.

* * * * *